US008864925B2

(12) United States Patent
Kimura et al.

(10) Patent No.: US 8,864,925 B2
(45) Date of Patent: Oct. 21, 2014

(54) METHOD FOR PRODUCING LAMINATED ELECTRONIC COMPONENT, AND LAMINATED ELECTRONIC COMPONENT

(75) Inventors: Kazunari Kimura, Tokyo (JP); Misaki Tabata, Tokyo (JP); Shigemitsu Tomaki, Tokyo (JP); Akira Nakamura, Tokyo (JP); Isao Abe, Tokyo (JP); Noriyuki Saito, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/811,167

(22) PCT Filed: Jul. 21, 2011

(86) PCT No.: PCT/JP2011/066560
§ 371 (c)(1),
(2), (4) Date: Jan. 18, 2013

(87) PCT Pub. No.: WO2012/011527
PCT Pub. Date: Jan. 26, 2012

(65) Prior Publication Data
US 2013/0115411 A1 May 9, 2013
US 2013/0266758 A2 Oct. 10, 2013

(30) Foreign Application Priority Data

Jul. 22, 2010 (JP) ................................ 2010-165398

(51) Int. Cl.
*C03B 29/00* (2006.01)
*H01G 4/40* (2006.01)
(Continued)

(52) U.S. Cl.
CPC ......... *B32B 38/0004* (2013.01); *C04B 2237/76* (2013.01); *C04B 2237/80* (2013.01); *H03H* (Continued)

(58) Field of Classification Search
CPC .... B32B 38/00; B32B 38/0004; B32B 18/00; B32B 5/00; B32B 38/0036; B32B 37/00; B32B 37/14; B32B 37/18; B32B 37/10

USPC .............. 156/182, 288, 297, 298, 299, 304.1, 156/306.6, 89.12, 89.11
See application file for complete search history.

(56) References Cited

U.S. PATENT DOCUMENTS 6,151,775 A * 11/2000 Sakai .............................. 29/830
6,153,290 A   11/2000 Sunahara
(Continued)

FOREIGN PATENT DOCUMENTS

CN   101364479 A   2/2009
JP   11 195873     7/1999
(Continued)

OTHER PUBLICATIONS

International Search Report Issued Aug. 30, 2011 in PCT/JP11/66560 Filed Jul. 21, 2011.
(Continued)

*Primary Examiner* — Philip Tucker
*Assistant Examiner* — Alex Efta
(74) *Attorney, Agent, or Firm* — Oblon, Spivak, McClelland, Maier & Neustadt, L.L.P.

(57) ABSTRACT

A method of manufacturing a laminated electronic part includes fabricating first and second laminated sheets by laminating an insulating function layer made of an unsintered ceramic material and a conductor layer, having a plurality of conductors two-dimensionally arranged in a vertical direction and in a horizontal direction to make up part of circuit components; cutting the first and second laminated sheets into sticks to create a plurality of first and second laminate sticks; fabricating a third laminated sheet by rotating the second laminate sticks by 90°, arranging the second laminate sticks to be each sandwiched between the first laminate sticks, and thermocompression bonding them for integration; singulating the third laminated sheet into chips and creating sintered bodies by sintering the unsintered chips to integrate the first laminate with the second laminate.

2 Claims, 10 Drawing Sheets

(51) Int. Cl.
 *H01G 4/005* (2006.01)
 *B32B 18/00* (2006.01)
 *B32B 5/00* (2006.01)
 *B32B 38/00* (2006.01)
 *H01G 4/30* (2006.01)
 *H01G 4/12* (2006.01)
 *B29C 65/00* (2006.01)
 *H03H 1/00* (2006.01)
 *H03H 7/01* (2006.01)

(52) U.S. Cl.
 CPC .............. 2001/0085 (2013.01); *C04B 2237/34* (2013.01); *C04B 2237/68* (2013.01); *H03H 7/0115* (2013.01); *H01G 4/40* (2013.01); *H01G 4/005* (2013.01); *B32B 18/00* (2013.01); *B32B 5/00* (2013.01); *B32B 38/0036* (2013.01); *C04B 2237/343* (2013.01); *C04B 2237/704* (2013.01); *H01G 4/30* (2013.01); *C04B 2237/346* (2013.01); *H01G 4/12* (2013.01)
 USPC ......................... 156/89.12; 156/182; 156/297

(56) References Cited

U.S. PATENT DOCUMENTS

| | | | |
|---|---|---|---|
| 6,228,196 B1 * | 5/2001 | Sakamoto et al. | 156/89.17 |
| 2007/0202257 A1 * | 8/2007 | Sakurai | 427/258 |
| 2009/0002920 A1 * | 1/2009 | Itamura et al. | 361/321.3 |
| 2009/0161293 A1 * | 6/2009 | Takeuchi et al. | 361/321.4 |

FOREIGN PATENT DOCUMENTS

| | | | |
|---|---|---|---|
| JP | 3425065 | | 5/2003 |
| JP | 2004 31743 | | 1/2004 |
| JP | 2004031743 A | * | 1/2004 |
| JP | 2004 363291 | | 12/2004 |
| JP | 2005 203629 | | 7/2005 |
| JP | 2009 59888 | | 3/2009 |
| JP | 2009059888 A | * | 3/2009 |
| JP | 2009 170737 | | 7/2009 |

OTHER PUBLICATIONS

Office Action issued Aug. 14, 2014, in Chinese Patent Application No. 201180036187.5.

* cited by examiner

METHOD FOR PRODUCING LAMINATED ELECTRONIC COMPONENT, AND LAMINATED ELECTRONIC COMPONENT

TECHNICAL FIELD

The present invention relates to a method of manufacturing a laminated electronic part and such a laminated electronic part, and more particularly, to an electronic part which includes a plurality of ceramic laminates that differ in the direction in which internal conductive layers are laminated.

BACKGROUND ART

Laminated electronic parts have been provided for implementing a variety of circuit functions. The laminated electronic part comprises circuit elements such as circuit components, connection conductors, and the like disposed on a plurality of wiring layers of a laminate in a distributed manner.

Meanwhile, as electronic devices are increasingly reduced in size and profile and provided with more and more functions, electronic parts which comprise the devices are highly required to be reduced in size and height (thickness), as well as to be increased in functionality and integration. For example, a filter for a laminated ceramic electronic part is one of main components of portable phones and wireless LAN devices. This filter employs a ceramic laminate which is constructed by forming electrodes on thin dielectric materials (laminate), and placing them one on another to form an inductor and a capacitor. Such a ceramic laminate is advantageous in providing for smaller size and lower profile. In addition, the ceramic laminate exhibits good characteristics in heat-resistivity, thermal expansion, thermal conductivity, resistance to chemical attack, and the like, as compared with resin-based glass epoxy laminates and the like, and is also utilized particularly for wiring of electronic parts to which higher integration is required. In this way, electronic parts including ceramic laminates are widely utilized in high-frequency electronic parts which are required to provide a variety of high functionality. However, as an electronic part is reduced in size, circuit elements (circuit components, connection conductors, and the like) disposed therein are necessarily brought in closer proximity, resulting in higher susceptibility to deteriorations in characteristics of the electronic part due to stray capacitance and undesired electromagnetic coupling. For this reason, several structures have been proposed for electronic parts to prevent mutual interference of circuit elements to one another, such as constructing an electronic part with a plurality of laminates which are laminated in different directions, and the like (see, for example, Patent Documents 1-4 below).

PRIOR ART DOCUMENTS

Patent Documents

Patent Document 1: JP-A-11-195873
Patent Document 2: JP-A-2004-31743
Patent Document 3: JP-A-2009-170737
Patent Document 4: Japanese Patent No. 3425065

SUMMARY OF THE INVENTION

Notably, although the structures described in the patent documents listed above are applied with a design idea for changing the direction in which conductors are laminated within a part, respective laminates which comprise the electronic part are individually sintered and adhered such that they are laminated in different directions to fabricate individual electronic parts (see Paragraphs 0038-0039 of Patent Document 2 and Patent Document 3). Therefore, the structures described in these documents require more efforts in manufacturing and is inferior in mass productivity.

Assuming, for example, that chip filters are manufactured, individual chips are sized to have the width, depth, and height dimensions of, for example, approximately 1 mm, 0.5 mm, and 0.35 mm, respectively, so that it is envisaged that difficulties will be actually involved in adhering laminates, which have even smaller dimensions, to each other to fabricate the chips. This is because it is not that laminates may be simply adhered to one another, but conductors included in adjacent laminates must be electrically connected to each other, thus requiring precise positioning and fixing in the adhesion. Moreover, as a smaller target (chip size) causes positioning errors to become relatively larger and highly accurate positioning to be exceptionally more difficult, it is not easy to individually perform the positioning of laminates one by one and adhere the laminates. Thus, the structures described in the aforementioned documents cannot be said to be a pragmatic structure suitable for mass production.

Also, the sintering of individual laminates not only involves complicated treatments but also causes a lower stability in shape, as compared with the laminates which are placed in groups. Particularly, small-sized individual laminates can suffer from deformations when they are sintered, and such deformations can cause misalignments between internal electrodes of the laminates when they are bonded to each other. As such, with the conventional structures of the parts, it is difficult to manufacture a laminated electronic part including a plurality of ceramic laminates which are laminated in different directions satisfactorily with respect to the yield rate and productivity.

It is therefore an object of the present invention to provide a new part structure which is more apt to exhibit satisfactory electric characteristics, even if it is reduced in size, for a laminate electronic part which includes a plurality of ceramic laminates which are laminated in different directions. More particularly, it is an object of the present invention to efficiently manufacture such a laminated electronic part.

To solve the foregoing problem and achieve the object, a method of manufacturing a laminated electronic part according to the present invention includes the steps of (1) fabricating a first laminated sheet by laminating one or more insulating function layers mainly made of an unsintered ceramic material and one ore more conductor layers, each having a plurality of conductors two-dimensionally arranged in a vertical direction and in a horizontal direction, where the conductors make up at least part of circuit components; (2) fabricating a second laminated sheet by laminating one or more insulating function layers mainly made of an unsintered ceramic material and one ore more conductor layers, each of which has a plurality of conductors two-dimensionally arranged in a vertical direction and in a horizontal direction, where the conductors make up at least part of circuit components; (3) cutting the first laminated sheet into sticks such that the sticks include a plurality of conductors arranged either in the vertical direction or in the horizontal direction, thereby creating a plurality of first laminate sticks; (4) cutting the second laminated sheet into sticks such that the sticks include a plurality of conductors arranged either in the vertical direction or in the horizontal direction, thereby creating a plurality of second laminate sticks; (5) fabricating a third laminated sheet by rotating the second laminate sticks by 90° about a longitudinal axis of the second laminate stick, arranging the rotated second laminate sticks to be each sandwiched between the first laminate sticks, and thermocompression bonding the first laminate sticks and second laminate sticks for integration; (6) singulating the third laminated sheet into chips by cutting the third laminated sheet in the vertical direction and in the horizontal direction such that each chip includes a first laminate which is part of the first laminate stick and a second laminate which is part of the second laminate stick; and (7) creating sintered bodies by sintering the unsintered chips to integrate the first laminate with the second laminate.

The method of manufacturing a laminated electronic part according to the present invention is directed to a method of manufacturing an electronic part which has a structure made up of two or more bonded ceramic laminates which are laminated in different directions. However, rather than bonding individual laminates after sintering, as proposed in the past, the present invention involves bonding together those laminates, each of which is a stick-shaped grouping (including a plurality of the same laminates) such as laminate sticks (first laminate sticks and second laminate sticks), through thermocompression bonding (with application of heat and pressure) to fabricate the third laminated sheet which is made up of the bonded laminates which are laminated in different directions, where the third laminated sheet constitutes a grouping (a grouping of a plurality of sets of the laminates which are laminated in different directions) of these laminates (first laminate and second laminate). In this regard, the third laminated sheet is fabricated at temperatures lower than sintering temperatures (for example, 700-1600° C.) at which the sintering is performed after the first laminate sticks are bonded to the second laminate sticks. Specific heating temperatures for fabricating the third laminated sheet depend on the materials of the insulating function layer and conductor and therefore cannot be defined in general, but may be set, for example, in a range of approximately 30 to 200° C.

As described above, the present invention eliminates the need to handle individual laminates when bonding a plurality of laminates (first laminate, second laminate) which make up an electronic part, and can collectively bond the laminates in groups, thus demonstrating high operability and good productivity. Additionally, since the sintering is performed after the laminates are bonded, it is possible to suppress errors in shape which can be caused by the sintering.

The "insulating function layer" described above, typically refers to an insulating layer formed of a dielectric ceramic material, but is not so limited and may be a material layer formed of any of a variety of insulating ceramic materials such as a magnetic ceramic material, a semiconductor ceramic material, and the like, for example, in conformity to elements which are to be included within a laminated board. Additionally, a single laminate can be formed of a mixture of different insulating function layers.

Also, in the present invention, the laminates which make up an electronic part are not limited to two (only the first laminate and second laminate). For example, the electronic part may be made up of three laminates, or can have a structure made up of four more bonded laminates. When three or more laminates are included in this way, a third laminate stick, or further (fourth, fifth, . . . ) laminate sticks may be formed in a similar manner, in addition to the first laminate stick and second laminate stick, and they may be combined as appropriate to fabricate the third laminated sheet.

Further, in the present invention, all the laminates included in an electronic part need not be always laminated in different directions. For example, in an electronic part which has a first laminate, a second laminate, and a third laminate bonded in this order in a line, the electronic part may include a plurality of laminates which are laminated in the same direction, such as the first laminate and third laminate which are laminated in the same direction (for example, in the horizontal direction or in the vertical direction), the second laminate which is laminated in a different direction from them (for example, in the vertical direction or in the horizontal direction), and the like. Also, a method of fabricating the first laminated sheet and second laminated sheet, though not particularly specified, may include, in one example, fabricating a plurality of first ceramic sheets by printing conductors which form at least part of circuit components on a surface of a ceramic green sheet mainly made of an unsintered ceramic material such that the conductors are two-dimensionally arranged in the vertical direction and in the horizontal direction; and creating the first laminated sheet by putting the plurality of first ceramic sheets one on another, and thermocompression bonding the plurality of first ceramic sheets into integration. Similarly, the fabricating the second laminated sheet may include fabricating a plurality of second ceramic sheets by printing conductors which form at least part of circuit components on a surface of a ceramic green sheet mainly made of an unsintered ceramic material such that the conductors are two-dimensionally arranged in the vertical direction and in the horizontal direction; and creating the second laminated sheet by putting the plurality of second ceramic sheets one on another, and thermocompression bonding the plurality of second ceramic sheets into integration.

In this regard, the method of fabricating the laminated sheets (first laminated sheet and second laminated sheet) in the present invention can be also implemented, other than the method described above, by other methods such as, for example, by alternately printing and laminating a conductive paste for forming a conductor and an insulating paste for forming an insulating function layer.

On the other hand, a laminated electronic part according to the present invention comprises a first laminate including one or more insulating function layers mainly made of a ceramic material laminated with one or more conductor layers; and a second laminate including one or more insulating function layers mainly made of a ceramic material laminated with one or more conductor layers, and bonded with the first laminate, wherein the first laminate is laminated in a direction which intersects with a direction in which the second laminate is laminated, and the first laminate and the second laminate make up a sintered body which is integrated by sintering.

Also, the first laminate may be laminated in a direction substantially orthogonal to the direction in which the second laminate is laminated.

With the provision of such a part structure including a plurality of laminates which are laminated in different directions, it is possible to prevent mutual interference between circuit elements included in the electronic part, such as preventing electromagnetic coupling between a first laminate and a second laminate, for example, when an inductor is disposed in each of them, reducing a parasitic capacitance which can occur between circuit elements disposed in the first laminate and second laminate, respectively, and the like, to accomplish satisfactory electric characteristics.

Also, in one aspect of the laminated electronic part according to the present invention, the insulating function layer of the first laminate and the insulating function layer of the second laminate are made of the same material, wherein the insulating function layer of the first laminate and the insulating function layer of the second laminate are continuously sintered across a bonding surface therebetween.

Further, in another aspect of the laminated electronic part according to the present invention, the insulating function layer of the first laminate and the insulating function layer of the second laminate are made of different materials, wherein an interface exists on a bonding surface between the insulating function layer of the first laminate and the insulating function layer of the second laminate.

Further, in a yet another aspect of the laminated electronic part according to the present invention, a diffusion layer is formed on a bonding surface between the insulating function layer of the first laminate and the insulating function layer of the second laminate, where the diffusion layer includes either one or both of a material which constitutes the insulating function layer of the first laminate and a material which constitutes the insulating function layer of the second laminate.

According to a part structure formed with such a diffusion layer, the first laminate can be more firmly coupled to the second laminate, and a difference in thermal expansion between the first laminate and the second laminate is alleviated by the diffusion layer, thus making it possible to prevent troubles from occurring due to changes in temperature in subsequent manufacturing steps or after the part has been incorporated in a variety of products, such as cracking and peeling between the first laminate and the second laminate, damages on electric connections between the two laminates, and the like.

In the present invention, insulating function layers of different materials may be mixed in a single laminate, as described above. Specifically, either one or both of the first laminate and second laminate may have insulating function layers made of two or more different materials, in which case, the interface or diffusion layer may exist on part of the bonding surface between the first laminate and the second laminate.

Also, in a yet further aspect of the laminated electronic part according to the present invention, a third material other than those materials included in the first laminate and second material, for example, an adhesive material (for example, a material capable of providing an adhesive action by applying heat thereto) is not interposed between the first laminate and the second laminate, so that the first laminate is directly bonded to second laminate.

Also, in a yet further aspect of the laminated electronic part according to the present invention, the first laminate is bonded to the second laminate to create a bonding surface, wherein one or more of conductors included in the first laminate have their ends in abutment to surfaces of one or more of conductors included in the second laminate on the bonding surface, causing the conductor included in the first laminate to be electrically connected to the conductors included in the second laminate.

With the provision of such a conductor connection structure, a variety of circuit elements included in one laminate can be electrically connected to a variety of circuit elements included in another laminate without intervention of connection conductors such as vias, connection lines for connection, and the like, such as, for example, by directly connecting a circuit component (for example, an inductor) included in one laminate to be bonded to a circuit component (for example, a capacitor) included in another laminate, or directly connecting a ground electrode included in one laminate to a circuit component included in another laminate, and the like, thus making it possible to prevent deteriorations in electric characteristics due to the intervention of connection conductors.

The "laminated electronic part" in the present invention typically refers to a composite electronic part including a plurality of circuit components. While a "circuit component" may include, for example, a passive component such as an inductor, capacitor, resistor, varistor, and the like, the laminated electronic part may additionally include a variety of circuit elements, for example, an active component such as a transistor, and FET, an integrated circuit including active components such as IC, connection conductors such as a conductor line and inter-layer connection conductor (via, throughhole, and the like), ground electrode, terminal electrode, and the like (the same goes for the manufacturing method of the present invention as well).

Further, when the laminated electronic part, as referred to in the present invention, is considered from a functional point of view (type of part), the laminated electronic part as referred to in the present invention includes a variety of electronic parts, for example, filters such as bandpass filter, low pass filter and high pass filter, and the like, duplexer, diplexer, power amplifier module, high-frequency multiplexer module, isolator, sensor, and the like.

According to the method of manufacturing a laminated electronic part, and the laminated electronic part, it is possible to efficiently manufacture a laminated electronic part which includes a plurality of ceramic laminates which are laminated in different directions.

Other objects, features, and advantages of the present invention will be made apparent from the following description of embodiments of the present invention, made with reference to the drawings. It should be apparent to those skilled in the art that the present invention is not limited to the following embodiments, but a variety of modifications can be made within the scope of the invention defined by the appended claims. In the drawings, the same reference numerals indicate the same or corresponding parts.

BEST MODE FOR CARRYING OUT THE INVENTION

Referring to FIGS. 1 through 19, a method of manufacturing a laminated electronic part will be described in order in accordance with one embodiment of the present invention. In this regard, FIG. 1 and subsequent figures show three-dimensional coordinates consisting of an x-axis, a y-axis, and a z-axis, which are orthogonal to one another, as required. These figures and the embodiment will be described with definitions that, among these coordinate axes, the x-direction indicates a width direction (horizontal direction/left-to-right direction), the y-axis indicates a depth direction (horizontal direction/back-to-forth direction), and the z-direction indicates a height direction (vertical direction/up-down direction).

Figure 19:
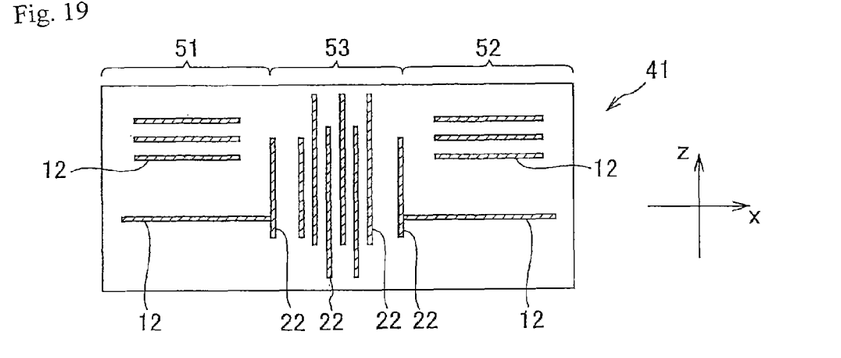
FIG. 19 is a diagram schematically showing a cross section of a chip (state after sintering) which is fabricated by cutting the third laminate sheet in the embodiment.

Also, as shown in FIG. 19, the manufacturing method of this embodiment is directed to manufacturing of a laminated electronic part 41 (hereinafter sometimes referred to as the "chip") which comprises first laminates 51, 52 that have their respective wiring layers (inner conductors 12) laminated in the vertical direction, stated another way, that have their respective wiring layers horizontally extending in parallel with an xy-plane (plane including the x-axis and y-axis); and a second laminate 53 that has its respective wiring layers (inner conductors 22) laminated in the horizontal direction, as opposed to the wiring layers of the first laminates 51, 52, stated another way, that has its respective wiring layers vertically extending in parallel with a yz-plane (plane including the y-axis and z-axis). Also, the first laminates 51, 52 comprise a left first laminate 51 bonded on the left side of the second laminate 53, and a right first laminate 52 bonded on the right side of the second laminate 53.

(1) Fabrication of First Laminate Sheet and First Laminate Stick

Figure 1:
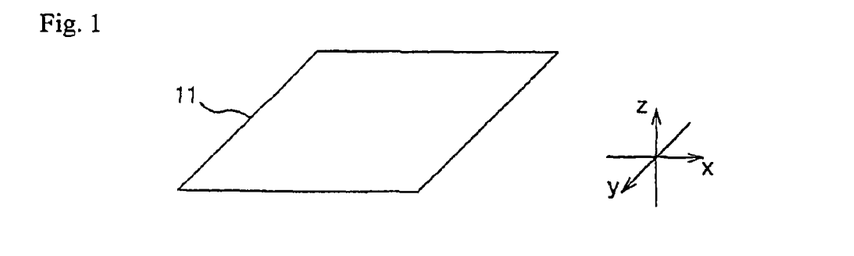
FIG. 1 is a perspective view schematically showing a step of a method of manufacturing a laminated electronic part according to a first embodiment of the present invention.
Figure 2:
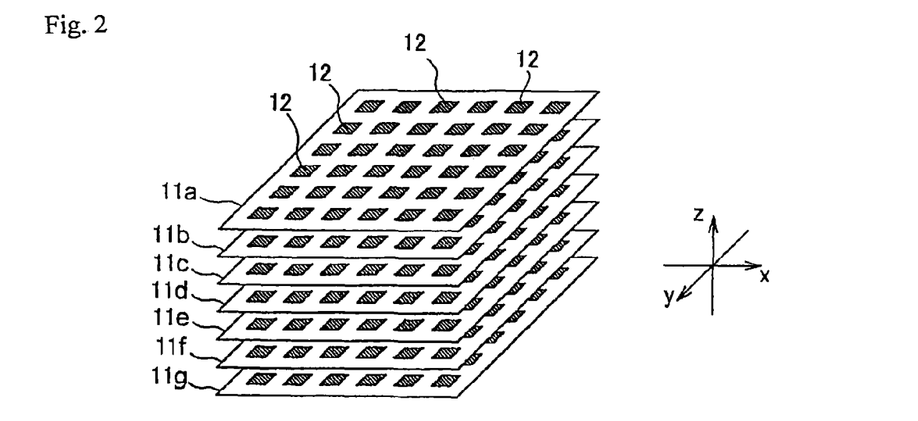
FIG. 2 is a perspective view schematically showing a step of the method of manufacturing a laminated electronic part according to the embodiment.

As shown in FIG. 1, the manufacturing method of this embodiment first prepares unsintered green sheets 11 formed of a ceramic material mainly composed of alumina, and coats a conductive paste on the surfaces of the sheets 11, and prints predetermined conductor patterns 12 on the surfaces of the green sheets 11, corresponding to the respective wiring layers of the first laminates 51, 52, thereby fabricating first ceramic sheets 11a, 11b, 11c, 11d, 11e, 11f, 11g (see FIG. 2). The conductor patterns 12 printed on these first ceramic sheets 11a-11g are formed such that the patterns 12 of a number corresponding to the number of chips 41 to be fabricated are arranged vertically and horizontally in a matrix shape.

In this event, the first ceramic sheets 11a-11g are formed with inter-layer connection conductors such as via holes, if required, in addition to the conductor patterns 12 corresponding to circuit elements which should be disposed on respective wiring layers of the first laminates, as described above (they are formed similarly on second ceramic sheets 21a-21d described later with reference to FIG. 7). Also, the ceramic material which comprises the green sheets can include, other than alumina, a variety of ceramic materials, for example, ferrite (particularly when an inductor is included), barium titanate (particularly when a capacitor is included), zinc oxide (particularly when a varistor is included), and the like.

Figure 3:
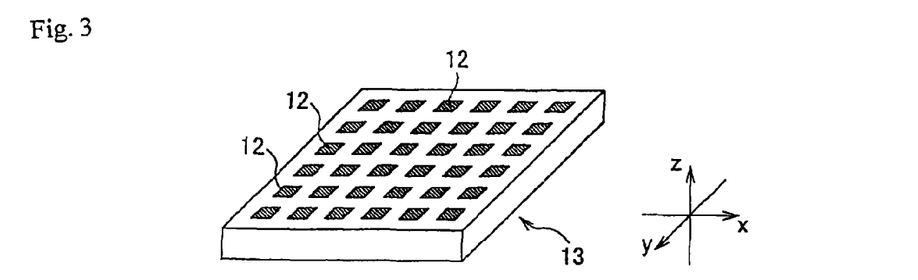
FIG. 3 is a perspective view schematically showing a step of the method of manufacturing a laminated electronic part according to the embodiment.
Figure 4:
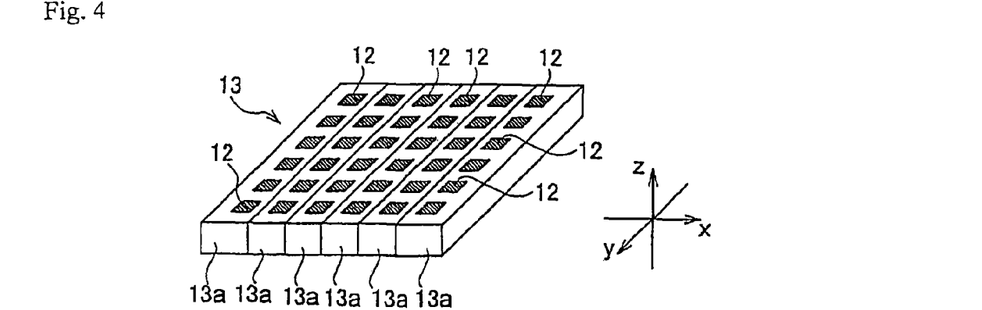
FIG. 4 is a perspective view schematically showing a step of the method of manufacturing a laminated electronic part according to the embodiment.
Figure 5:
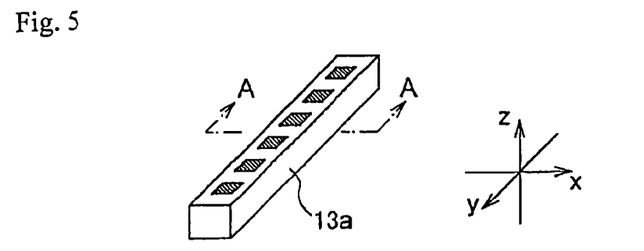
FIG. 5 is a perspective view schematically showing a step of the method of manufacturing a laminated electronic part according to the embodiment.
Figure 6:
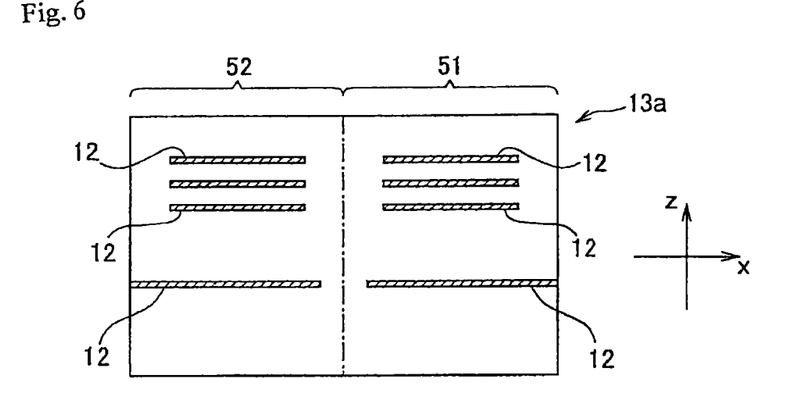
FIG. 6 is a diagram schematically showing a cross section (taken along line A-A in FIG. 5) of a first laminate stick in the embodiment.

Next, the ceramic sheets 11a-11g are laid one on another in a predetermined order, while aligned, as shown in FIG. 2, and thermocompression bonded for integration, resulting in a first laminated sheet 13, as shown in FIG. 3. Then, as shown in FIGS. 4 and 5, the first laminated sheet 13 is cut into strips to fabricate first laminate sticks 13a. This first laminate stick 13a has conductor patterns 12 formed and laminated such that the aforementioned right first laminate 52 is positioned in the left half of the first laminate stick 13a, and the aforementioned left first laminate 51 is positioned in the right half of the same, respectively, as shown in a cross-sectional view (taken along line A-A in FIG. 5) of FIG. 6. In this regard, in the lengthwise direction (vertical direction/y-axis direction) of the first laminate stick 13a, a plurality of sets of conductor patterns 12 are arranged to comprise the right first laminate 52 and left first laminate 51.

(2) Fabrication of Second Laminated Sheet and Second Laminate Stick

A second laminate stick is fabricated in a similar manner. As shown in FIG. 7, unsintered green sheets 11 are prepared in a manner similar to the fabrication of the first laminated sheet, and a conductive paste is coated on the surfaces of the sheets, and predetermined conductor patterns 22 are printed on the surfaces of the green sheets, corresponding to the respective wiring layers of the second laminate 53, thereby fabricating second ceramic sheets 21*a*, 21*b*, 21*c*, 21*d*. The number of the fabricated second ceramic sheets corresponds to the wiring layers of the second laminate 53. The conductor patterns 22 on the respective first ceramic sheets 21*a*-21*d* are formed such that the patterns 12 of a number corresponding to the number of chips to be fabricated are arranged vertically and horizontally in a matrix shape, in a manner similar to the first laminated sheet 13.

Figure 7:
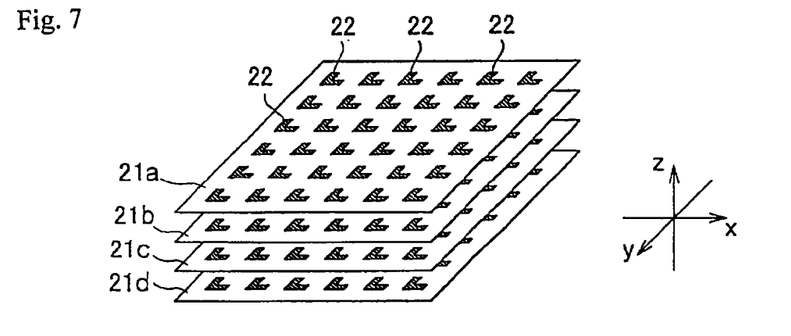
FIG. 7 is a perspective view schematically showing a step of the manufacturing method according to the embodiment.
Figure 8:
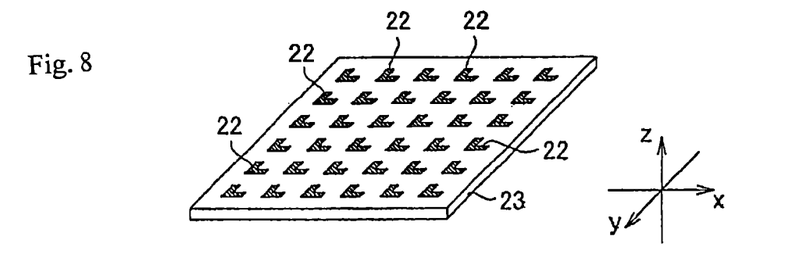
FIG. 8 is a perspective view schematically showing a step of the manufacturing method according to the embodiment.
Figure 9:
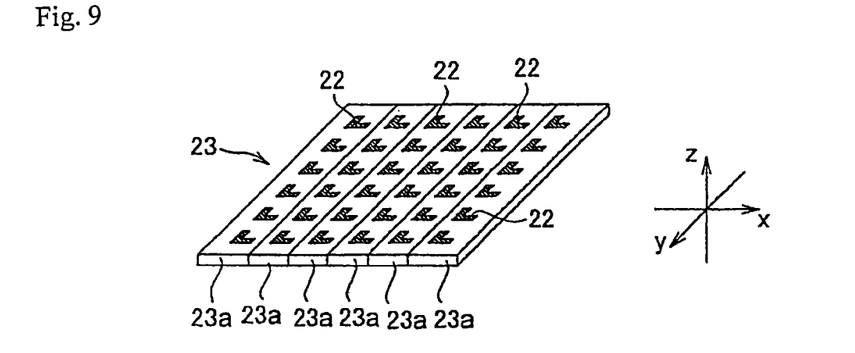
FIG. 9 is a perspective view schematically showing a step of the manufacturing method according to the embodiment.
Figure 10:
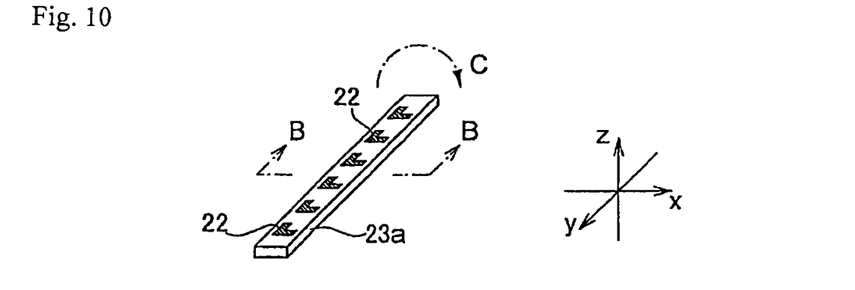
FIG. 10 is a perspective view schematically showing a step of the manufacturing method according to the embodiment.
Figure 11:
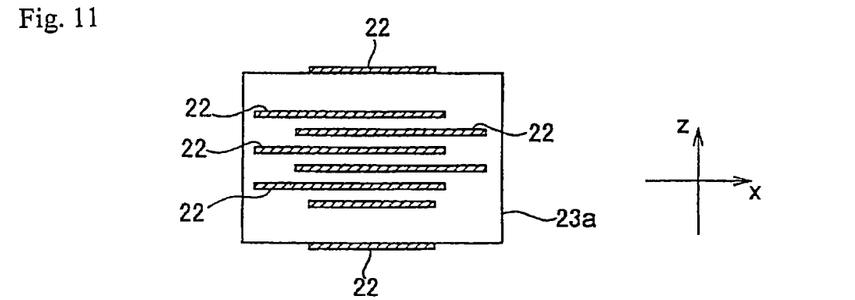
FIG. 11 is a diagram schematically showing a cross section (taken along line B-B in FIG. 10) of a second laminate stick in the embodiment.

Next, the second ceramic sheets 21*a*-21*d* are laid one on another in a predetermined order, while aligned, as shown in FIG. 7, and thermocompression bonded for integration, resulting in a second laminated sheet 23, as shown in FIG. 8. Subsequently, the second laminated sheet 23 is cut into strips to create second laminate sticks 23*a*, as shown in FIGS. 9 and 10. FIG. 11 shows a cross section (taken along line B-B in FIG. 10) of the second laminate stick 23*a*.

(3) Fabrication of Third Laminated Sheet (Reorganization of Laminated Sheets)

Figure 12:
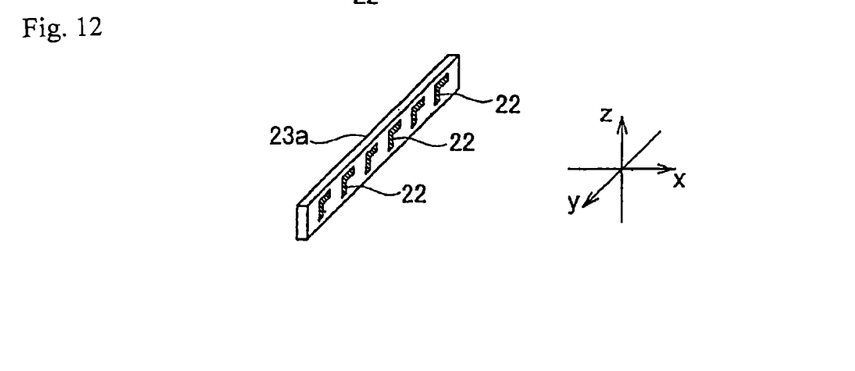
FIG. 12 is a perspective view schematically showing a step of the manufacturing method according to the embodiment.
Figure 13:
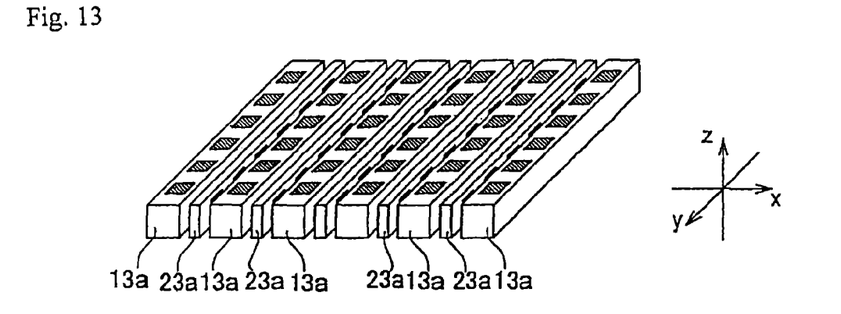
FIG. 13 is a perspective view schematically showing a step of the manufacturing method according to the embodiment.
Figure 14:
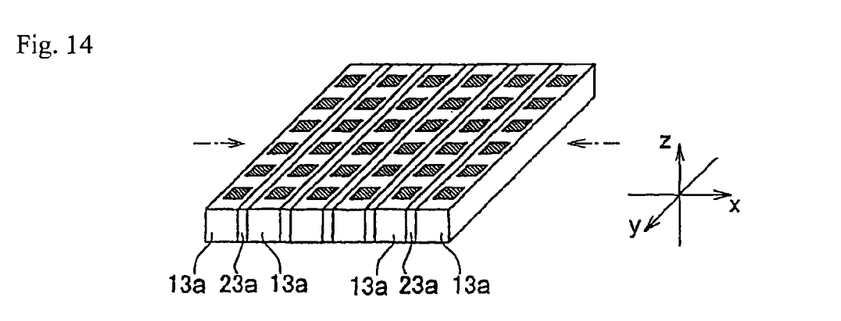
FIG. 14 is a perspective view schematically showing a step of the manufacturing method according to the embodiment.
Figure 15:
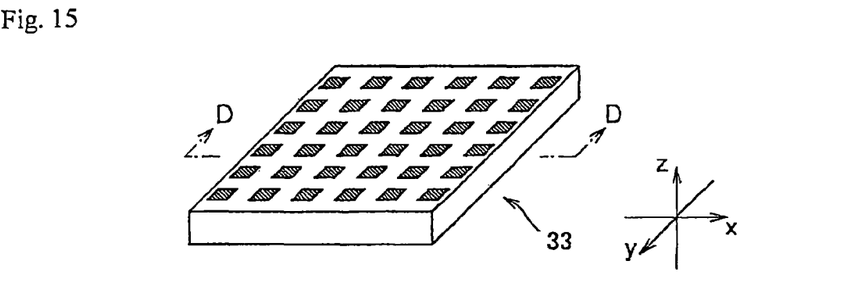
FIG. 15 is a perspective view schematically showing a step of the manufacturing method according to the embodiment.

Then, as shown in FIG. 12, the second laminate stick 23*a* is rotated by 90° about the longitudinal direction (y-axis) such that the respective wiring layers 22 of the second laminate stick 23*a* remain upright. Then, with this state maintained, the first laminates 13*a* and second laminates 23*a* are alternately arranged such that the single second laminate sticks 23*a* are sandwiched between the first laminate sticks 13*a*, as shown in FIG. 13. Next, as shown in FIG. 14, these first laminate sticks 13*a* and second laminate sticks 23*a* are thermocompression bonded for integration, thereby fabricating a third laminated sheet 33, as shown in FIG. 15.

Figure 16:
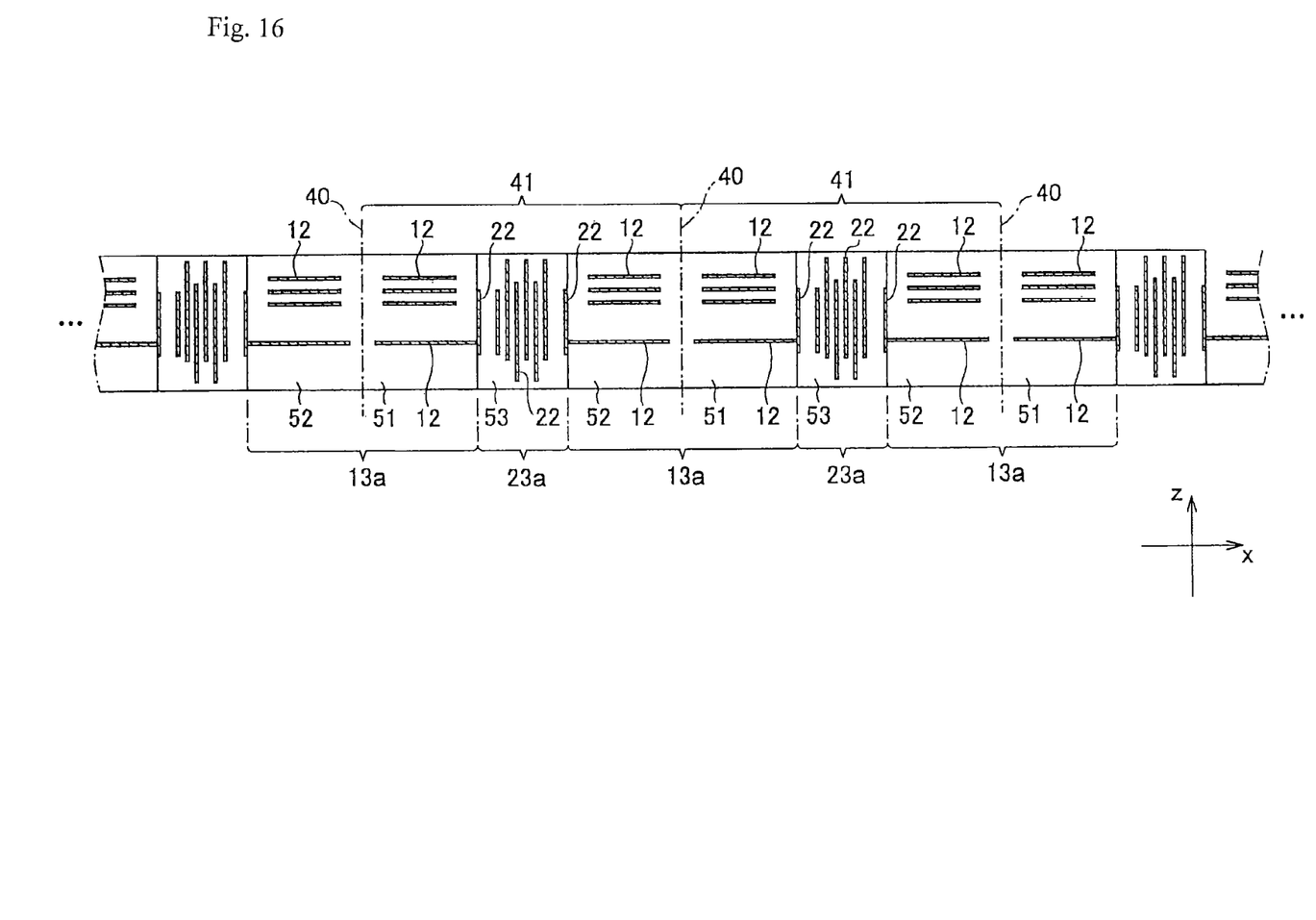
FIG. 16 is a diagram schematically showing a cross section (taken along line D-D in FIG. 15) of a third laminate sheet in the embodiment.

FIG. 16 shows a cross section of the third laminated sheet 33 in enlarged view. As shown in the figure, adjoining first laminate stick 13*a* and second laminate stick 23*a* are bonded together, so that the conductors 12 included in the first laminate stick 13*a* are electrically connected to the conductors 22 included in the second laminate 23*a*. It should be understood that the conductors 12, 22 illustrated in the drawings of this application are intended to show the concept of the present invention, and that the conductor patterns in the present invention are not limited to the illustrated example but can have a variety of shapes, numbers, and mutual connection forms of the conductors, in accordance with particular types of electronic parts to be fabricated.

(4) Singulation

Figure 17:
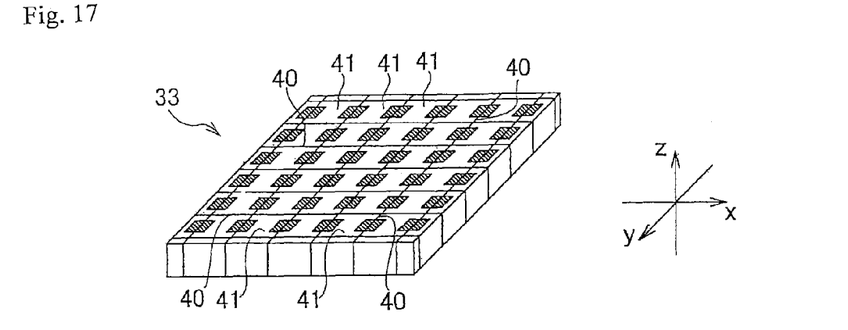
FIG. 17 is a perspective view schematically showing a step in the manufacturing method according to the embodiment.
Figure 18:
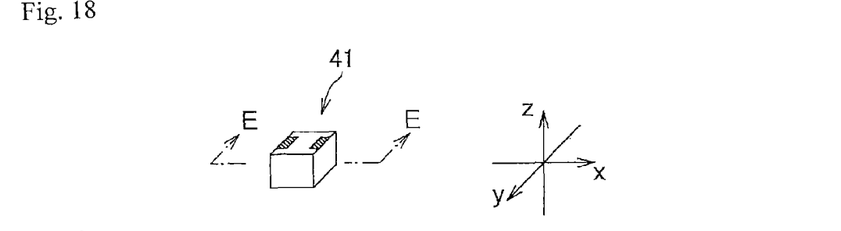
FIG. 18 is a perspective view schematically showing a step in the manufacturing method according to the embodiment.

As shown in FIGS. 16 and 17, the third laminated sheet 33 are cut along cut lines 40 in the vertical and horizontal directions into cubes (dices), to produce chips 41 as shown in FIG. 18.

Figure 20A:
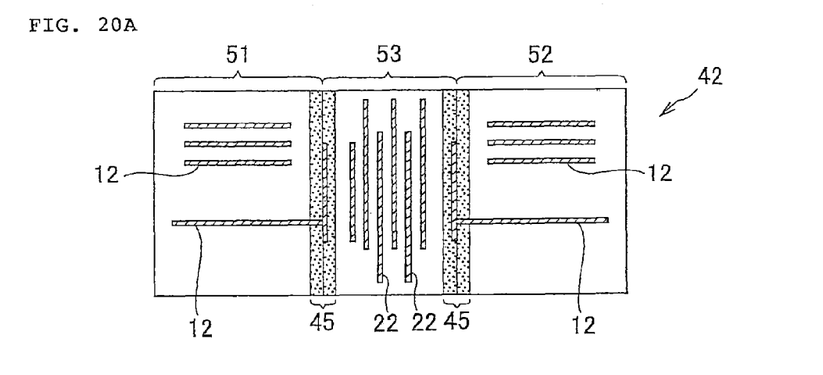
FIG. 20A is a diagram schematically showing a cross section of a chip (state after sintering) which is fabricated by cutting the third laminate sheet in an exemplary modification of the embodiment.

Subsequently, the individual chips are sintered. In this way, the first laminates (left first laminate 51 and right first laminate 52) and second laminate 53 are sintered to cause the interface between both laminates 51-53 to disappear, as shown in FIG. 19, thus resulting in a single sintered body which includes continuous ceramic layers (insulating function layer) as whole chips 41. After sintering the chips, external electrodes (terminal electrodes) are formed on the outer surface of each chip 41. As described above, the first laminates 51, 52 and second laminate 53 can be entirely (laminates as a whole) or partially (part of ceramic layers within the laminates) formed of different materials, in which case, diffusion layers 45 may be formed on respective surfaces on of both laminates formed of different materials, as shown in FIG. 20A. Also, depending on which materials the ceramic layers are composed of in the first laminates and second laminate, the diffusion layers can be formed such that the respective materials included in the first laminates 51, 52 and second laminate 53 diffuse into their counterpart laminates (the second laminate 53 for the first laminates 51, 52, and the first laminates 51, 52 for the second laminate 53), as shown in FIG. 20A, or such that materials included in the first laminates 51, 52 diffuse into the second laminate 53, as shown in FIG. 20B, or materials included in the second laminate 53 may diffuse into the first laminates 51, 52, as shown in FIG. 20C.

Figure 20B:
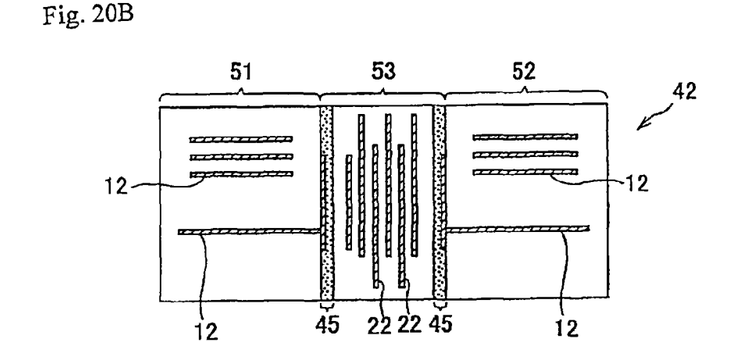
FIG. 20B is a diagram schematically showing a cross section of a chip (state after sintering) which is fabricated by cutting the third laminate sheet in another exemplary modification of the embodiment.
Figure 20C:
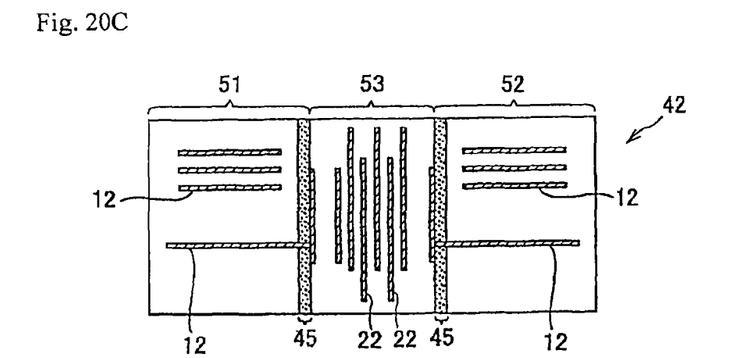
FIG. 20C is a diagram schematically showing a cross section of a chip (state after sintering) which is fabricated by cutting the third laminate sheet in a further exemplary modification of the embodiment.

As appreciated, FIGS. 20A-20C described above conceptually show the resulting sintered laminates when the first laminates 51, 52 and second laminate 53 are entirely formed of different materials. When these laminates are formed partially of different materials, the diffusion layers 45 are not formed to be continuous from the top to the bottom of the chip in the height direction as shown in FIG. 20, but diffusion layers and interfaces may be partially formed (intermittently in the height direction or only in portions where different materials come in contact with each other).

Figure 21A:
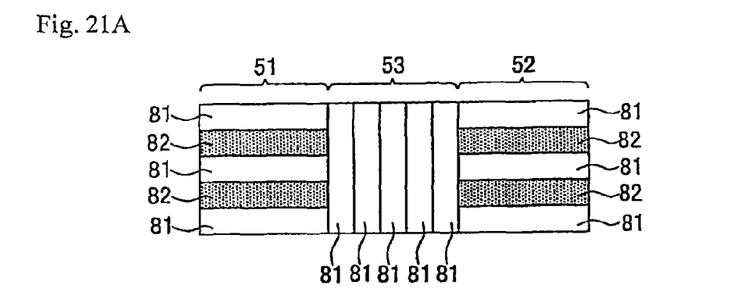
FIG. 21A is a diagram shcematicall showing a cross section of a chip (state before sintering) in a further modification of the embodiment.
Figure 21B:
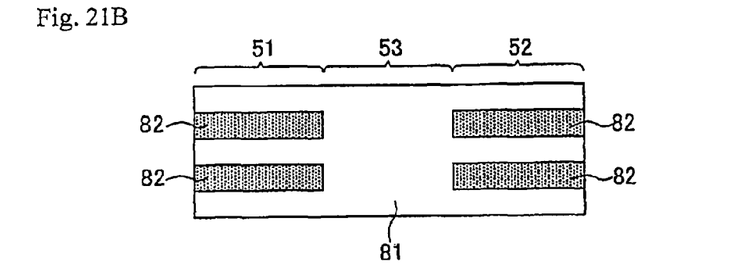
FIG. 21B is a cross-sectional view schematically showing the state of the chip shown in FIG. 21A after sintering.

Specifically, as shown in FIG. 21A (before sintering the chips), the first laminates 51, 52 comprise a laminated structure composed of first ceramic layers 81 made of a first ceramic material and second ceramic layers 82 made of a second ceramic material, while the second laminate 53 comprises a laminated structure composed of first ceramic layers 81 made of the first ceramic material. In such a case, interfaces and diffusion layers may be partially formed in the height direction of the chip, as shown in FIG. 21B, after sintering the chip.

Figure 22A:
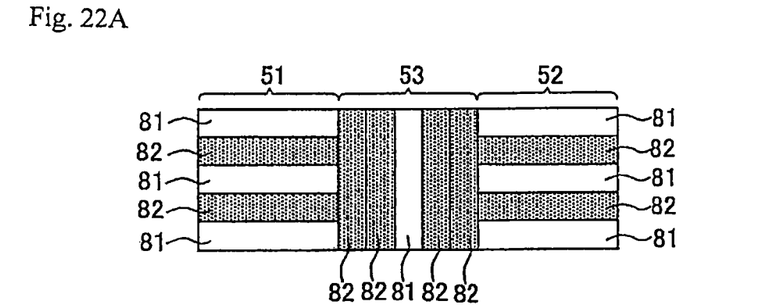
FIG. 22A is a diagram schematically showing a cross section of a chip (state before sintering) in a yet further exemplary modification of the embodiment.
Figure 22B:
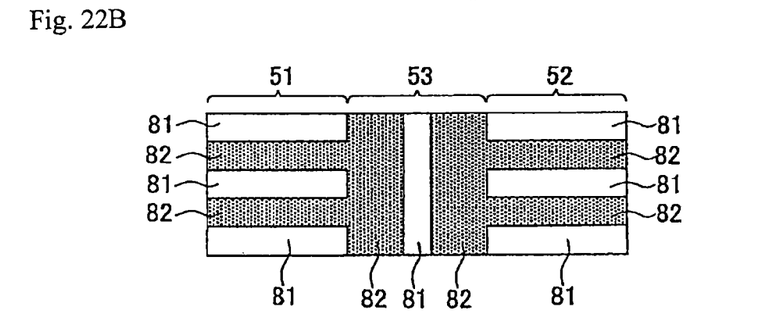
FIG. 22B is a cross-sectional view schematically showing the state of the chip shown in FIG. 22A after sintering.
Figure 23A:
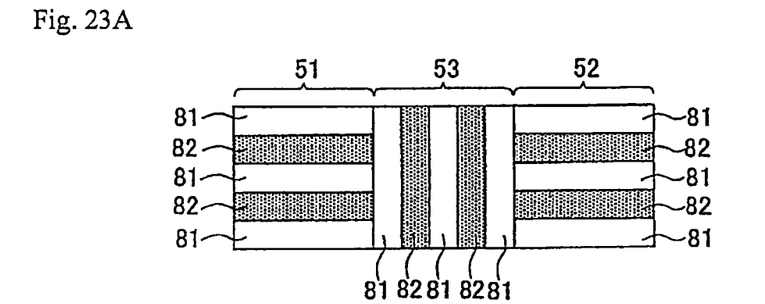
FIG. 23A is a diagram schematically showing a cross section of a chip (state before sintering) in a yet further exemplary modification of the embodiment.
Figure 23B:
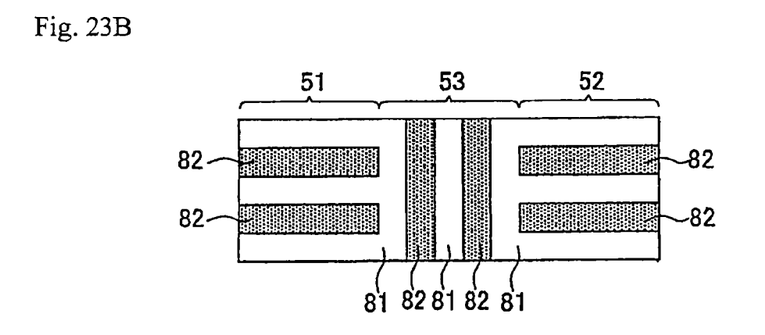
FIG. 23B is a cross-sectional view schematically showing the state of the chip shown in FIG. 23A after sintering.

Likewise, when the second laminate 53 employs second ceramic layers 82 to be in contact with the first laminates 51, 52 as shown in FIG. 22A (before sintering), or when the second laminate 53 employs first ceramic layers 81 to be in contact with the first laminates 51, 52 as shown in FIG. 23A (before sintering), interfaces and diffusion layers are partially formed in the height direction of the chip (where the first ceramic layers 81 are in contact with the second ceramic layers 82), respectively, as shown in FIGS. 22B and 23B, after sintering. As appreciated, such interfaces and diffusion layers are formed in a similar manner when three or more types of ceramic layers are laminated.

Figure 24:
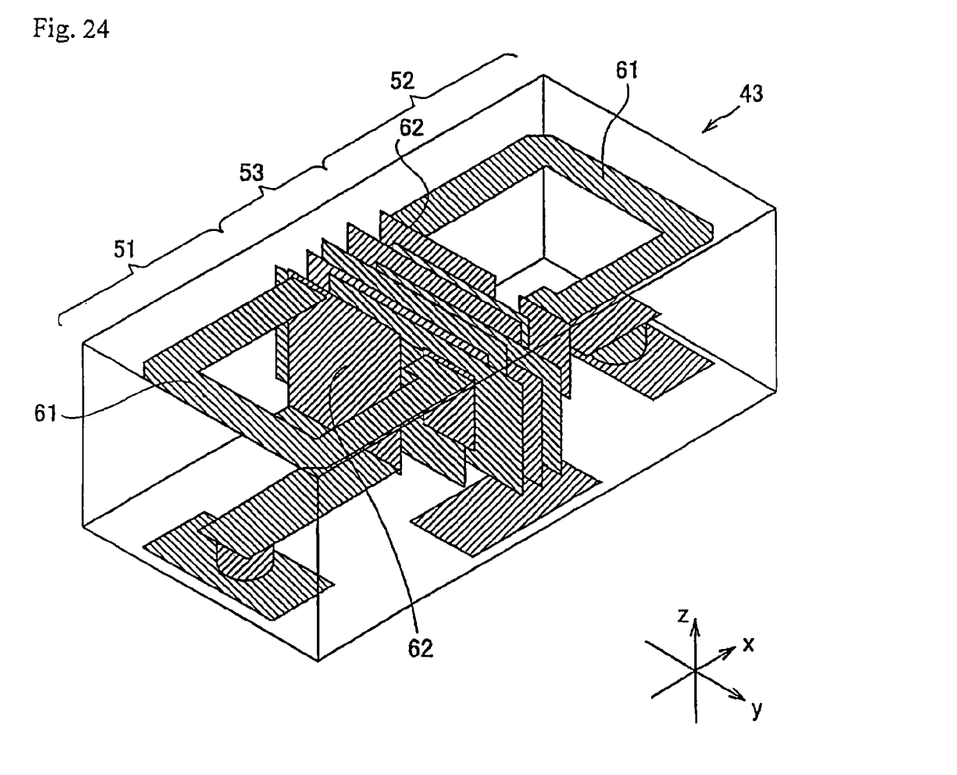
FIG. 24 is a perspective view schematically showing an electronic part (filter) which is fabricated by applying the manufacturing method according to the embodiment in a see-through representation.

FIG. 24 shows an exemplary structure of a filter chip which is fabricated in accordance with the foregoing embodiment. As shown in FIG. 24, conductors (for example, inductor conductors 61) formed on internal wiring layers of the first laminates (left first laminate 51 and right first laminate 52) can be laminated in a direction orthogonal to a direction in which conductors (for example, capacitor electrodes 62) disposed on internal wiring layers of the second laminate 53 are laminated, or the inductor conductors 61 of the first laminates 51, 52 can be electrically connected to the capacitor electrodes 62 of the second laminate 53 directly or through a short wire, thereby reducing the filter 43 in size and height. Even with the smaller and lower filter 43, satisfactory electric characteristics can be ensured.

Figure 25:
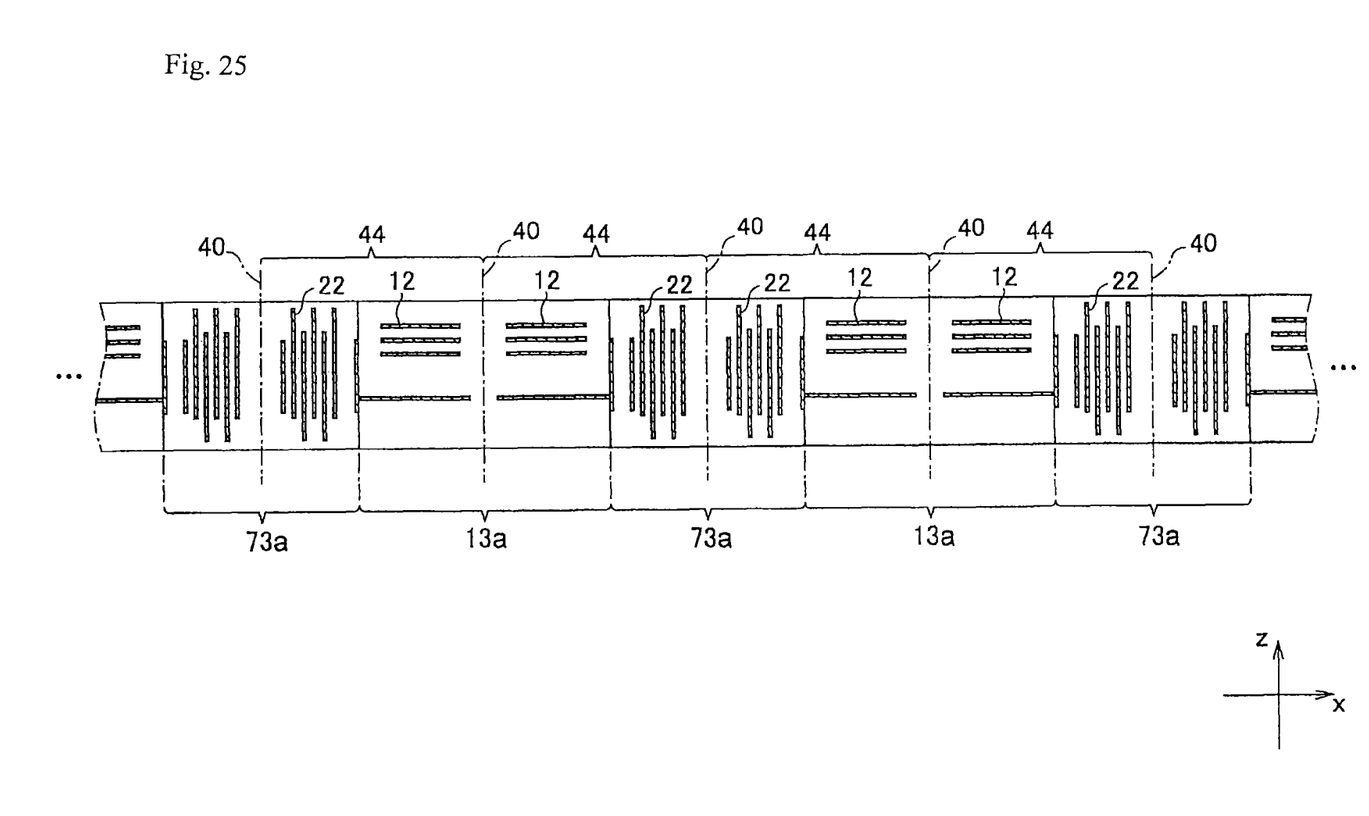
FIG. 25 is a cross-sectional view schematically showing another example of the third laminated sheet which is fabricated by applying the manufacturing method according to the embodiment in a manner similar to FIG. 16 described above.

Further, FIG. 25 shows another exemplary structure of the third laminated sheet. In the foregoing embodiment (FIG. 16), the third laminated sheet 33 is cut along the bisectors of the first laminate sticks 13*a* in the vertical direction to fabricate individual chips 41. Alternatively, as shown in FIG. 25, second laminate sticks 73*a* can also be cut along cut lines 40 to fabricate chips 44 which comprise only two laminates. In this event, the second laminate stick 73*a* may also be formed with a set of conductor patterns 22 (conductor patterns 22 in a left-hand region and a right-hand region of the second laminate stick 73*a*, respectively) in bilateral symmetry in a manner similar to the first laminate sticks 13*a*. Further, it should be apparent to those skilled in the art that, in addition to the implementations shown in FIGS. 25 and 16, the present invention can be applied to fabricate the third laminated sheet by combining a variety of numbers of laminate sticks in various orders of arrangement, to provide chips.

DESCRIPTION OF REFERENCE NUMERALS

11 Ceramic Green Sheet
11*a*, 11*b*, 11*c*, 11*d*, 11*e*, 11*f*, 11*g* First Ceramic Sheets
12, 22, 61, 62 Internal Conductors
13 First Laminated Sheet
13*a* First Laminate Stick
21*a*, 21*b*, 21*c*, 21*d* Second Ceramic Sheets
23 Second Laminated Sheet
23*a*, 73*a* Second Laminate Sticks
33 Third Laminated Sheet
40 Cut Line for Singulation
41, 42, 43, 44 Laminated Electronic Parts (Chips)
45 Diffusion Layer
51 First Laminate (Left First Laminate)
52 First Laminate (Right First Laminate)
53 Second Laminate
81 First Ceramic Layer
82 Second Ceramic Layer

The invention claimed is:

1. A method of manufacturing a laminated electronic part, comprising:
fabricating a first laminated sheet by laminating one or more insulating function layers mainly made of an unsintered ceramic material and one or more conductor layers, each having a plurality of conductors two-dimensionally arranged in a vertical direction and in a horizontal direction, said conductors making up at least part of circuit components;
fabricating a second laminated sheet by laminating one or more insulating function layers mainly made of an unsintered ceramic material and one or more conductor layers, each having a plurality of conductors two-dimensionally arranged in a vertical direction and in a horizontal direction, said conductors making up at least part of circuit components;
cutting said first laminated sheet into sticks such that said sticks include a plurality of conductors arranged either in the vertical direction or in the horizontal direction, thereby creating a plurality of first laminate sticks;
cutting said second laminated sheet into sticks such that said sticks include a plurality of conductors arranged either in the vertical direction or in the horizontal direction, thereby creating a plurality of second laminate sticks;
fabricating a third laminated sheet by rotating said second laminate sticks by 90° about a longitudinal axis of said second laminate stick, arranging said rotated second laminate sticks to be each sandwiched between said first laminate sticks, and thermocompression bonding said first laminate sticks and second laminate sticks for integration;
singulating said third laminated sheet into chips by cutting said third laminated sheet in the vertical direction and in the horizontal direction such that each chip includes a first laminate which is part of said first laminate stick and a second laminate which is part of said second laminate stick; and
creating sintered bodies by sintering said unsintered chips to integrate said first laminate with said second laminate.

2. A method of manufacturing a laminated electronic part according to claim 1, wherein said step of fabricating a first laminated sheet includes:
fabricating a plurality of first ceramic sheets by printing conductors which form at least part of circuit components on a surface of a ceramic green sheet mainly made of an unsintered ceramic material such that the conductors are two-dimensionally arranged in the vertical direction and in the horizontal direction; and
creating said first laminated sheet by putting said plurality of first ceramic sheets one on another, and thermocompression bonding said plurality of first ceramic sheets into integration, and
said step of fabricating a second laminated sheet includes the steps of:
fabricating a plurality of second ceramic sheets by printing conductors which form at least part of circuit components on a surface of a ceramic green sheet mainly made of an unsintered ceramic material such that the conductors are two-dimensionally arranged in the vertical direction and in the horizontal direction; and
creating said second laminated sheet by putting said plurality of second ceramic sheets one on another, and thermocompression bonding said plurality of second ceramic sheets into integration.

* * * * *